(12) United States Patent
Zhang

(10) Patent No.: US 10,446,193 B2
(45) Date of Patent: *Oct. 15, 2019

(54) MIXED THREE-DIMENSIONAL MEMORY

(71) Applicant: Guobiao Zhang, Corvallis, OR (US)

(72) Inventor: Guobiao Zhang, Corvallis, OR (US)

(73) Assignees: Hangzhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 214 days.

This patent is subject to a terminal disclaimer.

(21) Appl. No.: 15/494,539

(22) Filed: Apr. 23, 2017

(65) Prior Publication Data

US 2017/0229158 A1    Aug. 10, 2017

Related U.S. Application Data

(63) Continuation-in-part of application No. 14/636,353, filed on Mar. 3, 2015, now Pat. No. 9,666,237.

(Continued)

(30) Foreign Application Priority Data

Feb. 28, 2017  (CN) .......................... 2017 1 0109704
Mar. 2, 2017   (CN) .......................... 2017 1 0119051

(51) Int. Cl.
*G11C 5/02*    (2006.01)
*H01L 27/06*   (2006.01)
*H01L 49/02*   (2006.01)
*G11C 8/12*    (2006.01)
*H01L 27/112*  (2006.01)

(52) U.S. Cl.
CPC ................ *G11C 5/025* (2013.01); *G11C 8/12* (2013.01); *H01L 27/0688* (2013.01); *H01L 27/1128* (2013.01); *H01L 27/11246* (2013.01); *H01L 28/00* (2013.01); *H01L 2224/32145* (2013.01);

(Continued)

(58) Field of Classification Search
CPC ........... G11C 5/025; G11C 8/12; H01L 28/00; H01L 27/11246; H01L 27/0688; H01L 27/1128; H01L 2224/73265; H01L 2224/32145

See application file for complete search history.

(56) References Cited

U.S. PATENT DOCUMENTS 4,404,655 A   9/1983 Naiff
4,424,579 A   1/1984 Roesner
(Continued)

OTHER PUBLICATIONS

Spence et al. "Mask Data Volume—Historical Perspective and Future Requirements", 22nd European Mask & Lithography Conf. , 2006, Proc. of SPIE vol. 6281.

*Primary Examiner* — Michael C Zarroli

(57) ABSTRACT

The present invention discloses a mixed three-dimensional memory (3D-$M_x$). It comprises memory arrays (or, memory blocks) of different sizes. In a 3D-$M_x$ with mixed memory blocks, the memory blocks with different sizes are formed side-by-side. In a 3D-$M_x$ with mixed memory arrays, a plurality of small memory arrays are formed side-by-side underneath a single large memory array.

10 Claims, 3 Drawing Sheets

Related U.S. Application Data

(60) Provisional application No. 61/979,504, filed on Apr. 14, 2014.

(52) U.S. Cl.
CPC ............... *H01L 2224/73265* (2013.01); *H01L 2924/00012* (2013.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,515,888 B2 | 2/2003 | Johnson et al. |
| 6,624,485 B2 | 9/2003 | Johnson |
| 6,794,253 B2 | 9/2004 | Lin et al. |
| 7,952,904 B2 | 5/2011 | Zhang |
| 8,547,719 B2 * | 10/2013 | Park ..................... G11C 5/02 365/230.06 |
| 8,699,257 B2 * | 4/2014 | Zhang ................. H01L 21/268 257/211 |
| 8,735,902 B2 * | 5/2014 | Tang ................ H01L 27/11563 257/278 |
| 8,803,214 B2 * | 8/2014 | Tang ................. H01L 27/0688 257/314 |
| 9,190,412 B2 * | 11/2015 | Zhang ................ H01L 27/1021 |
| 9,396,764 B2 * | 7/2016 | Zhang ...................... G11C 5/02 |
| 9,576,612 B2 * | 2/2017 | Park ....................... G11C 5/025 |
| 9,666,237 B2 * | 5/2017 | Zhang .................... G11C 5/025 |

* cited by examiner

MIXED THREE-DIMENSIONAL MEMORY

CROSS-REFERENCE TO RELATED APPLICATIONS

This application is a continuation-in-part of application "Mixed Three-dimensional memory", application Ser. No. 14/636,353, filed Mar. 3, 2015, which claims benefit of a provisional application, "Three-dimensional memory with Mixed Memory Arrays", Application Ser. No. 61/979,504, filed Apr. 14, 2014.

BACKGROUND

1. Technical Field of the Invention

The present invention relates to the field of integrated circuit, and more particularly to three-dimensional memory (3D-M).

2. Prior Art

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). The 3D-EPROM could be one-time-programmable (3D-OTP) or multiple-time-programmable (3D-MTP). A 3D-M may further comprise at least one of a memristor, a resistive random-access memory (RRAM or ReRAM), a phase-change memory, a programmable metallization cell (PMC), a conductive-bridging random-access memory (CBRAM) or other memory devices.

U.S. Pat. No. 5,835,396 issued to Zhang on Nov. 3, 1998 discloses a 3D-ROM (FIG. 1A). It comprises a substrate 0 and a substrate circuit OK located thereon. An insulating dielectric 0d covers the substrate circuit OK and is planarized. A first memory level 10 is stacked above the insulating dielectric 0d, with a second memory level 20 stacked above the first memory level 10. The first and second memory levels 10, 20 are coupled to the substrate circuit OK through contact vias 13a, 23a, respectively.

Each of the memory levels (e.g. 10, 20) comprises a plurality of upper address-lines (i.e. y-lines, e.g. 12a-12d, 22a-22d), a plurality of lower address-lines (i.e. x-lines, e.g. 11a, 21a) and a plurality of memory devices (e.g. 1aa-1ad, 2aa-2ad) at the intersections between the upper and lower address-lines. Each memory level (e.g. 20) comprises at least a memory array (e.g. 200A). A memory array 200A is a collection of memory devices (e.g. 2aa-2ad) in a memory level 20 that share at least one address-line (e.g. 21a, 22a-22d). Within a single memory array 200A, all address-lines (e.g. 21a, 22a-22d) are continuous; between adjacent memory arrays, address-lines are not continuous.

A 3D-M die 1000 comprises a plurality of memory blocks (e.g. 1aa, 1ab . . . 1dd) (FIG. 1B). The structure shown in FIG. 1A is a portion of the memory block 1aa. In a memory block 1aa, its topmost memory level 20 comprises only a single memory array 200A. In other words, within the topmost memory level 20 of the memory block 1aa, all address-lines 21a, 22a-22d are continuous and terminate at or near the edge of the memory block 1aa. In prior art, all memory blocks (e.g. 1aa-1dd) in a 3D-M die 1000 have the same size; and, within each memory block 100, the memory arrays (e.g. 100A, 200A) in all memory levels (e.g. 10, 20) have the same size.

Each memory device 1aa is a two-terminal device having at least two possible states. Each memory device 1aa further comprises a diode or a diode-like device. To be more specific, the memory cell 1aa comprises a diode layer and a programmable layer. The diode layer is broadly interpreted as any layer whose resistance at the read voltage is substantially lower than when the applied voltage has a magnitude smaller than or polarity opposite to that of the read voltage. The states of the programmable layer (which represent the data stored therein) are written during manufacturing (i.e. mask-programmed, as in FIG. 1A) or after manufacturing (i.e. electrically-programmable).

When the storage capacity of a memory die is small, generally only a single type of information is stored in a single memory die. However, as the storage capacity of a 3D-M increases (e.g. a single 3D-M die can store 1 Tb and even higher), more types of information will be stored in a single 3D-M die. For example, both data (e.g. digital books, digital maps, digital music, digital movies, and/or digital videos) and codes (e.g. operating systems, software, and/or digital games) will be stored in a single 3D-M die. Although data may tolerate slow access, codes require fast access. Additionally, data generally has a stringent requirement on the memory cost. In prior art, all memory arrays (or, all memory blocks) in a 3D-M die have the same size. This causes several problems. If the memory array is too small, a high die cost may meet the cost requirement of the data. On the other hand, if the memory array is too large, slow access speed may not meet the speed requirement of the codes.

OBJECTS AND ADVANTAGES

It is a principle object of the present invention to provide a three-dimensional memory (3D-M) which stores both data and codes.

It is a further object of the present invention to provide a three-dimensional memory (3D-M) with an optimized array efficiency and memory speed.

In accordance with these and other objects of the present invention, a mixed 3D-M (3D-$M_x$) is disclosed.

SUMMARY OF THE INVENTION

In order to store both data and codes in a same 3D-M die while meeting their respective requirements on cost and speed, a mixed 3D-M (3D-$M_x$) is disclosed. It comprises memory arrays (or, memory blocks) of different sizes. Data (e.g. digital books, digital maps, digital music, digital movies, and/or digital videos), which require a lower cost per bit and can tolerate slow access, are stored in large memory arrays (or, memory blocks), whereas codes (e.g. operating systems, software, and/or digital games), which require fast access and can tolerate a higher cost per bit, are stored in small memory arrays (or, memory blocks). The 3D-$M_x$ die could comprise mixed memory blocks, mixed memory arrays, or a combination thereof. In a 3D-$M_x$ with mixed memory blocks, the memory blocks with different sizes are formed side-by-side. In a 3D-$M_x$ with mixed memory arrays, a plurality of small memory arrays are formed side-by-side underneath a single large memory array.

Accordingly, the present invention discloses a mixed three-dimensional memory (3D-$M_x$), comprising: a first memory block for storing data, said first memory block comprising a plurality of vertically stacked memory levels including a first topmost memory level, said first topmost memory level comprising only a first memory array; a second memory block for storing codes, said second memory block comprising another plurality of vertically stacked memory levels including a second topmost level, said second topmost memory level comprising only a second memory array; wherein said second memory block is located side-by-side from said first memory block, said first memory array is larger than said second memory array.

The present invention further discloses a mixed three-dimensional memory (3D-$M_x$) comprising a 3D-M block, said 3D-M block further comprising a plurality of vertically stacked memory levels including a topmost memory level and at least an intermediate memory level, wherein: said topmost memory level comprises only a first memory array; said intermediate memory level comprises at least second and third memory arrays, wherein said second and third memory arrays do not share any address-lines; wherein said first memory array fully covers both said second and third memory arrays.

Figure 1A:
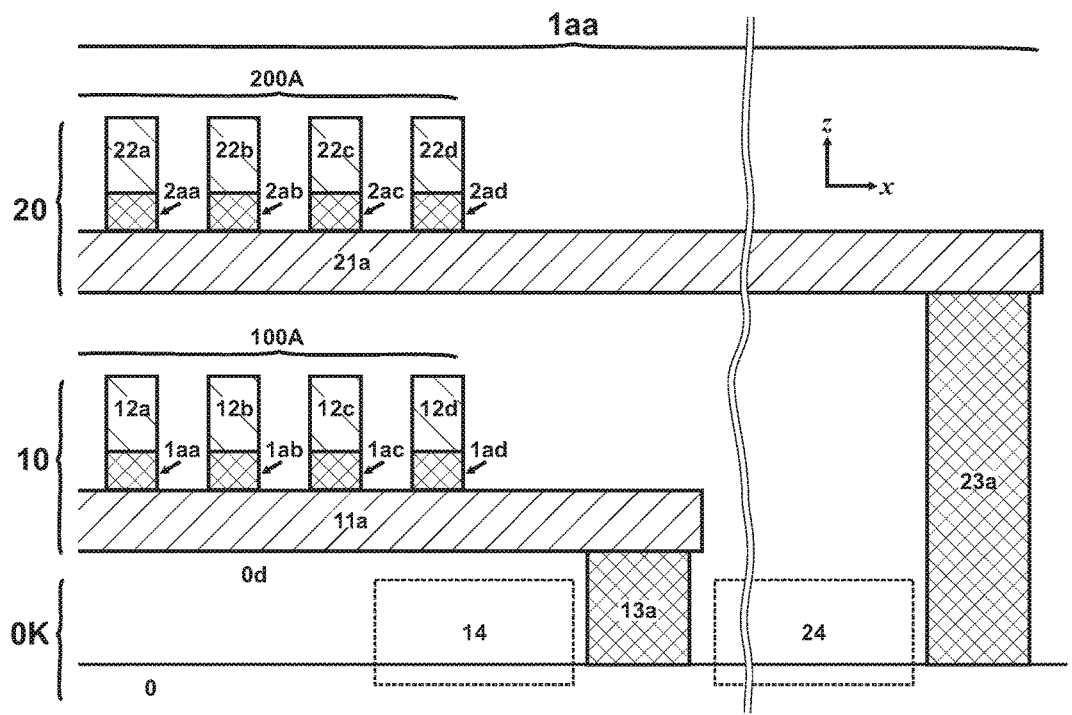
FIG. 1A is a cross-sectional view of a prior-art three-dimensional memory (3D-M)
Figure 1B:
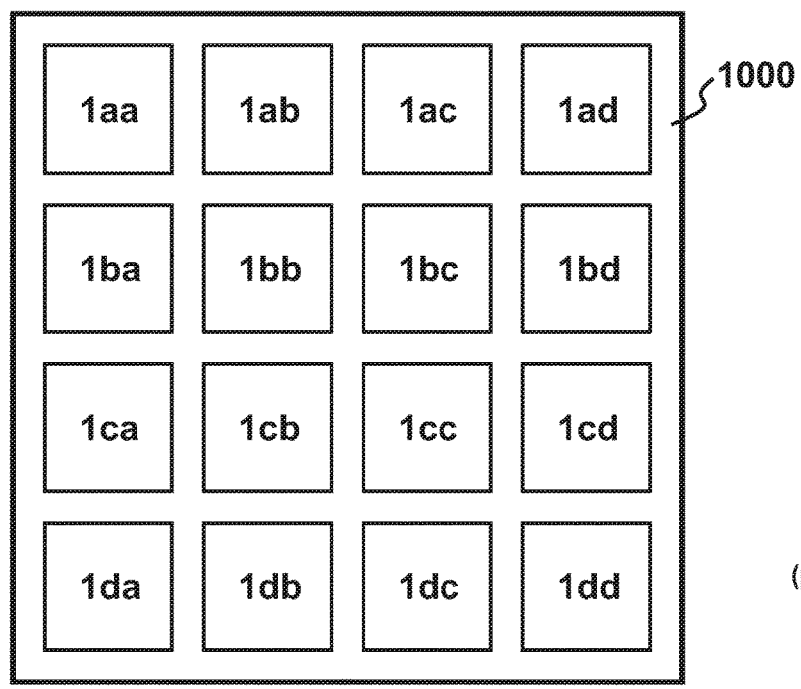
FIG. 1B is a die diagram of the prior-art 3D-M.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. Although the examples shown in these figures are 3D-MPROM, this concept can be readily extended to other types of 3D-M.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2:
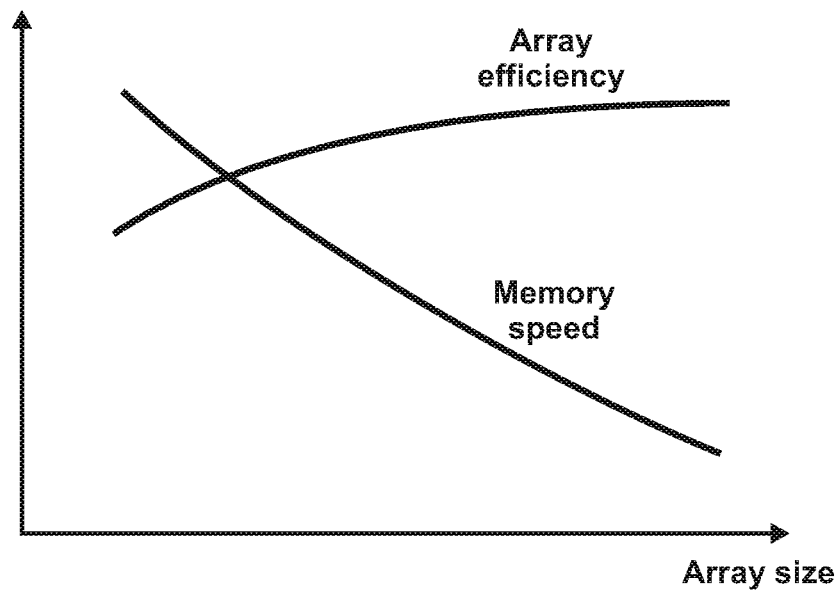
FIG. 2 illustrates the relationship between the array efficiency, the memory speed and the array size.

Referring now to FIG. 2, the relationships between the array efficiency, the memory speed and the array size are disclosed. When the memory arrays are small, because the peripheral circuit of each memory array has a fixed size, the array efficiency degrades. As the memory arrays become larger, the array efficiency improves. However, as the parasitic capacitance and resistance increase, the access speed suffers.

In order to store both data and codes in a same 3D-M die while meeting their respective requirements on cost and speed, a mixed 3D-M (3D-$M_x$) is disclosed. It comprises memory arrays (or, memory blocks) of different sizes. Data (e.g. digital books, digital maps, digital music, digital movies, and/or digital videos), which require a lower cost per bit and can tolerate slow access, are stored in large memory arrays (or, memory blocks), whereas codes (e.g. operating systems, software, and/or digital games), which require fast access and can tolerate a higher cost per bit, are stored in small memory arrays (or, memory blocks). The 3D-$M_x$ die could comprise mixed memory blocks or mixed memory arrays. In the mixed memory blocks (FIG. 3), the memory blocks with different sizes are formed side-by-side. In the mixed memory arrays (FIG. 4), a plurality of small side-by-side memory arrays are formed underneath a single large memory array.

Figure 3:
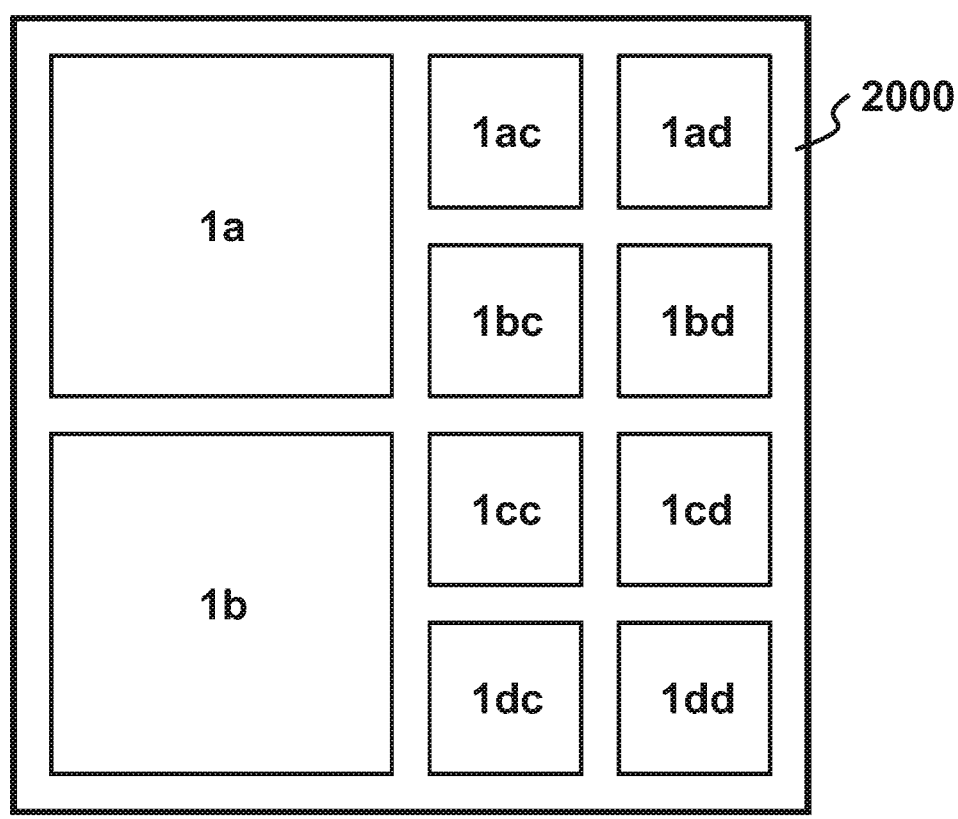
FIG. 3 is a die diagram of a preferred 3D-$M_x$ with mixed memory blocks.

Referring now to FIG. 3, a preferred 3D-$M_x$ with mixed memory blocks is shown. The 3D-$M_x$ die 2000 comprises a plurality of memory blocks 1a, 1b, 1ac-1dd. The memory blocks 1a, 1b contain larger memory arrays than those in memory blocks 1ac-1dd. As such, the memory blocks 1a, 1b can be used to store data, e.g. digital books, digital maps, digital music, digital movies, and/or digital videos, whereas the memory blocks 1ac-1dd can be used to store codes, e.g. operating systems, software, and/or digital games.

Figure 4:
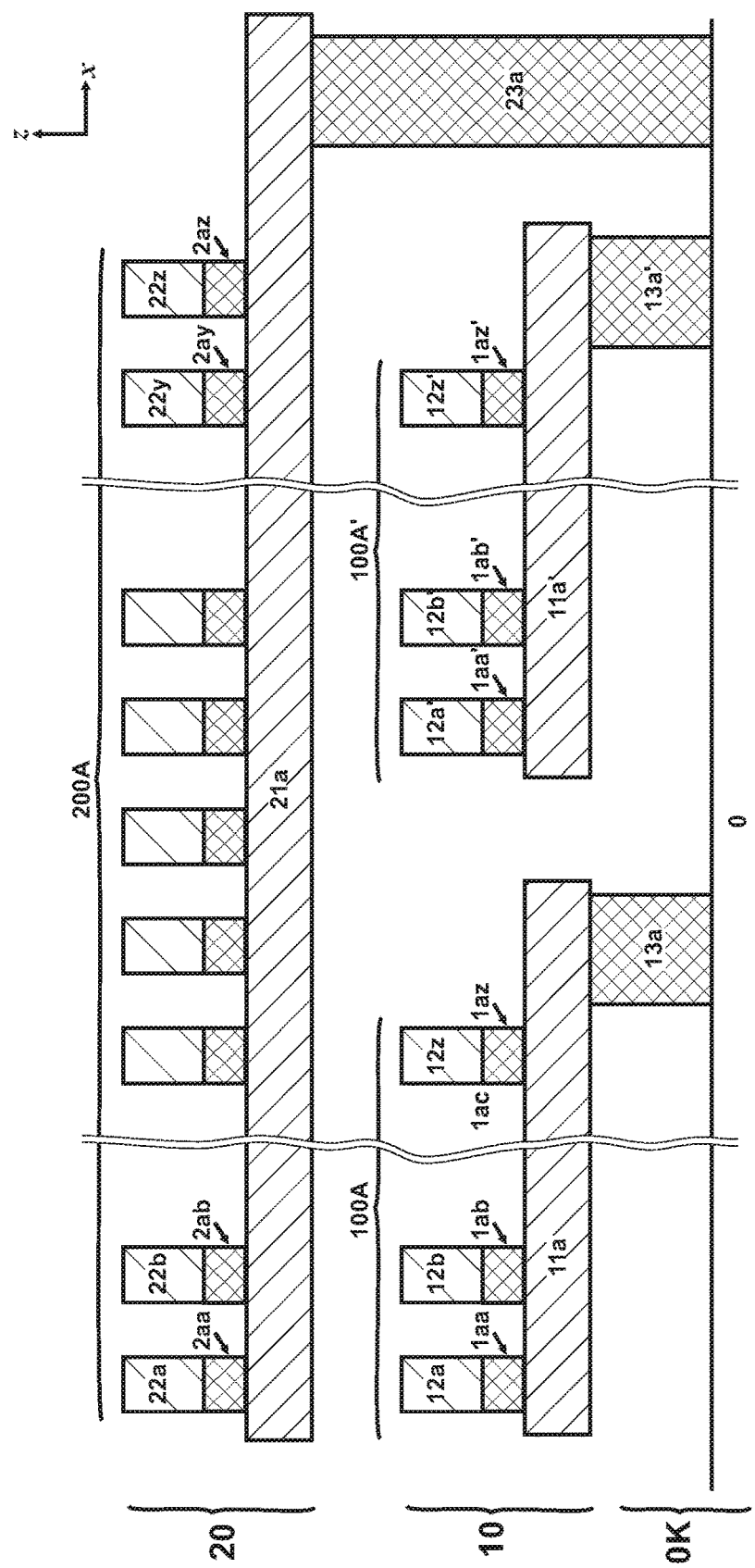
FIG. 4 is a cross-sectional view of a preferred 3D-$M_x$ with mixed memory arrays.

Referring now to FIG. 4, a preferred 3D-$M_x$ with mixed memory arrays is shown. This preferred 3D-$M_x$ comprises two memory levels 10, 20 with the memory level 20 stacked above the memory level 10. The memory level 20 is the topmost memory level and comprises a single memory array 200A, while the memory level 10 is an intermediate memory level and comprises two side-by-side memory arrays 100A, 100A'. Apparently, the memory array 200A in the memory level 20 is much larger than the memory arrays 100A, 100A' in the memory level 10. The memory array 200A can be used to store data, e.g. digital books, digital maps, digital music, digital movies, and/or digital videos, whereas the memory arrays 100A, 100A' can be used to store codes, e.g. operating systems, software, and/or digital games.

While illustrative embodiments have been shown and described, it would be apparent to those skilled in the art that many more modifications than that have been mentioned above are possible without departing from the inventive concepts set forth therein. For example, the mixed 3D-M disclosed in the present invention could be 3D-RAM or 3D-ROM. It could be either mask-programmed, or electrically-programmable. It could be further one-time-programmable, or multiple-time-programmable. The invention, therefore, is not to be limited except in the spirit of the appended claims

What is claimed is:

1. A mixed three-dimensional memory (3D-$M_x$), comprising:
    a first memory block, said first memory block comprising a first plurality of vertically stacked memory levels including a first topmost memory level, said first topmost memory level comprising a first memory array, said first memory array comprising first memory devices, each of said first memory devices sharing at least a first address-line with at least another one of said first memory devices;
    a second memory block, said second memory block comprising a second plurality of vertically stacked memory levels including a second topmost level, said second topmost memory level comprising a second memory array, said second memory array comprising second memory devices, each of said second memory devices sharing at least a second address-line with at least another one of said second memory devices;
    wherein, said second memory block is located side-by-side with said first memory block; said first topmost memory level is located at the same physical level with said second topmost memory level; and, said first memory array is physically larger and comprises more memory devices than said second memory array.

2. The memory according to claim 1, wherein said first memory block stores data.

3. The memory according to claim 2, wherein said data includes digital books, digital maps, digital music, digital movies, and/or digital videos.

4. The memory according to claim 1, wherein said second memory block stores code.

5. The memory according to claim 4, wherein said code includes operating system, software, and/or digital games.

6. A mixed three-dimensional memory (3D-$M_x$) comprising at least a 3D-M block, said 3D-M block further comprising a plurality of vertically stacked memory levels including a topmost memory level and at least an intermediate memory level, wherein:

said topmost memory level is the topmost memory level among all of said memory levels and comprises a first memory array, said first memory array comprising first memory devices, each of said first memory devices sharing at least a first address-line with at least another one of said first memory devices;

said intermediate memory level is a memory level below said topmost memory level and comprises at least second and third memory arrays, wherein said second memory array comprises second memory devices, each of said second memory devices sharing at least a second address-line with at least another one of said second memory devices; said third memory array comprises third memory devices, each of said third memory devices sharing at least a third address-line with at least another one of said third memory devices; and, said second and third memory arrays do not share any memory devices or address-lines;

wherein said first memory array fully covers both said second and third memory arrays; and, said first memory array is physically larger and comprises more memory devices than said second or third memory array.

7. The memory according to claim 6, wherein said first memory array stores data.

8. The memory according to claim 7, wherein said data include digital books, digital maps, digital music, digital movies, and/or digital videos.

9. The memory according to claim 6, wherein said second or third memory array stores code.

10. The memory according to claim 9, wherein said code includes operating system, software, and/or digital games.

* * * * *